US008368155B2

(12) United States Patent
Abraham et al.

(10) Patent No.: US 8,368,155 B2
(45) Date of Patent: Feb. 5, 2013

(54) SYSTEMS AND METHODS FOR PREPARING FREESTANDING FILMS USING LASER-ASSISTED CHEMICAL ETCH, AND FREESTANDING FILMS FORMED USING SAME

(75) Inventors: Margaret H. Abraham, Portola Valley, CA (US); David P. Taylor, Hawthorne, CA (US)

(73) Assignee: The Aerospace Corporation, El Segundo, CA (US)

( * ) Notice: Subject to any disclaimer, the term of this patent is extended or adjusted under 35 U.S.C. 154(b) by 264 days.

(21) Appl. No.: 12/869,597

(22) Filed: Aug. 26, 2010

(65) Prior Publication Data

US 2012/0049200 A1 Mar. 1, 2012

(51) Int. Cl.
*H01L 23/20* (2006.01)

(52) U.S. Cl. ...................... 257/419; 73/25.05

(58) Field of Classification Search ............... 73/25.01, 73/25.05, 31.06; 257/418, 419
See application file for complete search history.

(56) References Cited

U.S. PATENT DOCUMENTS

| 5,662,814 | A | 9/1997 | Sugino |
| 5,909,048 | A | 6/1999 | Sugino |
| 6,610,605 | B2 | 8/2003 | Rowlette et al. |
| 6,878,567 | B2 | 4/2005 | Winer et al. |
| 7,419,915 | B2 | 9/2008 | Abraham et al. |
| 7,419,917 | B2 | 9/2008 | Abraham |
| 2008/0128841 | A1* | 6/2008 | Fujimori et al. ............. 257/418 |
| 2009/0151429 | A1* | 6/2009 | Jun et al. ..................... 73/31.06 |

OTHER PUBLICATIONS

Arnone et al., "Ansiotropic laser etching of oxidized (100) silicon," Appl. Phys. Lett. 54 (3), Jan. 16, 1989, pp. 225-227.

Ehrlich et al., "Submicrometer-linewidth doping and relief definition in silicon by laser-controlled diffusion," Appl. Phys. Lett. 41 (3), Aug. 1, 1982, pp. 297-299.
Ehrlich et al., "Laser-induced microscopic etching of GaAs and InP," Appl. Phys. Lett. 36 (8), Apr. 15, 1980, pp. 698-700.
Ehrlich et al., "Laser chemical technique for rapid direct writing of surface relief in silicon," Appl. Phys. Lett. 38 (12), Jun. 15, 1981, pp. 1018-1020.
Maki et al., "Laser bilayer etching of GaAs surfaces," Appl. Phys. Lett. 55 (2), Jul. 10, 1989, pp. 91-93.
Sugino et al., "Through-Oxide Cleaning of Silicon Surface by Photo-Excited Radicals," Extended Abstracts of the 19th Conference on Solid State Devices and Materials, IEEE Tokyo Section, Tokyo, Japan, Aug. 25-27, 1987, pp. 207-210.
Sugino et al., "Ultraviolet excited Cl-radical etching of Si through native oxides," Appl. Phys. Lett. 76 (9), Nov. 1, 1994, pp. 5498-5502.
Allen et al., "Microfabricated structures for the in situ measurement of residual stress, Young's modulus, and ultimate strain of thin films," Appl. Phys. Lett. 51(4), Jul. 27, 1996, pp. 241-243.

(Continued)

*Primary Examiner* — Thomas L Dickey
(74) *Attorney, Agent, or Firm* — Jones Day; Nicola A. Pisano; Jaime D. Choi

(57) ABSTRACT

Systems and methods for preparing freestanding films using laser-assisted chemical etch (LACE), and freestanding films formed using same, are provided. In accordance with one aspect a substrate has a surface and a portion defining an isotropically defined cavity; and a substantially continuous film is disposed at the substrate surface and spans the isotropically defined cavity. In accordance with another aspect, a substrate has a surface and a portion defining an isotropically defined cavity; and a film is disposed at the substrate surface and spans the isotropically defined cavity, the film including at least one of hafnium oxide ($HfO_2$), diamond-like carbon, graphene, and silicon carbide (SiC) of a predetermined phase. In accordance with still another aspect, a substrate has a surface and a portion defining an isotropically defined cavity; and a multi-layer film is disposed at the substrate surface and spans the isotropically defined cavity.

19 Claims, 11 Drawing Sheets

OTHER PUBLICATIONS

Bromley et al., "A technique for the determination of stress in thin films," J. Vac. Sci. Technol. B 1(4), Oct.-Dec. 1983, pp. 1364-1366.

Lee et al., "The fabrication of thin, freestanding, single-crystal, semiconductor membranes," J. Electrochem. Soc., 137(8), Aug. 1990, pp. 2556-2574.

Ozkan et al., "Strain relaxation and defect formation in heteroepitaxial $Si_{1-x}Ge_x$ films via surface roughening induced by controlled annealing experiments," Appl. Phys. Lett. 70(17), Apr. 28, 1997, pp. 2247-2249.

* cited by examiner

SYSTEMS AND METHODS FOR PREPARING FREESTANDING FILMS USING LASER-ASSISTED CHEMICAL ETCH, AND FREESTANDING FILMS FORMED USING SAME

FIELD

This application generally relates to processing films using laser-assisted chemical etch (LACE).

BACKGROUND

Laser-assisted chemical etch (LACE) has been used to prepare structures useful in micro-electrical mechanical systems (MEMS), nano-electrical mechanical systems (NEMS), and microfluidics. LACE may involve exposing a structure that includes a substrate and a film to a chemical etchant, such as chlorine gas ($Cl_2$), and to light. The light preferentially enhances the reaction etchant with respect to the substrate, but not with respect to the film. As such, the substrate may be selectively etched in regions exposed to the light and to the chemical etchant, thus creating a cavity that frees the film from the substrate in a selected region.

However, only selected types of structures have been prepared thus far using LACE. For example, FIGS. 1A-1B illustrate cross-sectional views of exemplary structures formed using the techniques described in U.S. Pat. Nos. 7,419,915 and 7,419,917 to Abraham, the entire contents of each of which are incorporated by reference herein. FIG. 1A illustrates a precursor structure including bulk silicon (Si) substrate 110 and patterned silicon dioxide ($SiO_2$) layer 120, which is buried within Si substrate 110, and formed using ion implantation. $SiO_2$ layer 120 may be partially freed from Si substrate 110 by simultaneously exposing the substrate to an etchant such as chlorine ($Cl_2$) gas (not illustrated) and to a laser beam. Abraham discloses that such exposure locally heats volumes of Si substrate 110 about $SiO_2$ layer 120, preferentially etching away portions of substrate 110 to form cavity 130 about the $SiO_2$ layer 120.

Other references disclose forming channels in substrates beneath surface films, also by exposing such structures to an etchant and to light. However, the structures prepared using such methods are limited in the type of channel that may be formed and/or the quality of the surface film remaining after processing. For example, U.S. Pat. No. 5,662,814 to Sugino discloses using $Cl_2$ gas and ultraviolet light to etch an Si substrate having a porous $SiO_2$ film on its surface. The Si substrate is etched anisotropically via the pores in the $SiO_2$ film; that is, certain crystallographic planes of the Si substrate are preferentially etched, resulting in hollows in the substrate having shapes that depend on the crystal structure of the Si, such as pyramidal hollows. The pores in the $SiO_2$ film are subsequently covered using another film.

U.S. Pat. No. 6,878,567 to Winer discloses patterning an $SiO_2$ or silicon nitride layer on top of an Si substrate so as to have access holes. The Si substrate is exposed to $Cl_2$ gas via the access holes, and a laser beam used to mill channels in the substrate between the access holes. Thus, although the channels of Winer are not limited to anisotropically etched hollows, as in Sugino, the techniques of both references rely on the use of pores or access holes in the surface films overlying the substrate. Such pores or access holes may limit not only the quality and strength of the surface layer, but also the types of applications for which the final product can be used. Also, the available film compositions are limited.

SUMMARY

Embodiments of the invention provide systems and methods for preparing free-standing films using laser-assisted chemical etch (LACE), and free-standing films prepared using same. In some embodiments, the free-standing films are prepared by diffusively delivering an etchant to the substrate through a surface film while transmitting laser light to the substrate via the surface film. Together, the etchant and the laser light isotropically define a cavity in the substrate beneath the surface film. The diffusive nature of the etchant delivery obviates the need to provide access holes through the film, which may otherwise detrimentally affect the structural integrity of the film. In other embodiments, the free-standing films have any of a variety of suitable compositions besides silicon dioxide or silicon nitride. For example, the films may be multilayer films, and/or may include hafnium oxide ($HfO_2$), diamond-like carbon, graphene, or silicon carbide (SiC) of a predetermined phase. Such films optionally may include access holes defined therethrough to facilitate etching of the underlying substrate.

In accordance with one aspect of the present invention, a structure includes a substrate having a surface and a portion defining an isotropically defined cavity; and a substantially continuous film disposed at the substrate surface and spanning the isotropically defined cavity.

In some embodiments, the film has a substantially uniform thickness and a substantially uniform composition through the thickness. The film may have a thickness between about 1 nm and about 1 µm. The film may include multiple layers. The film may include, for example, silicon oxide, hafnium oxide, silicon nitride, diamond-like carbon, graphene, or silicon carbide of a selected phase.

The substrate may include, for example, silicon, germanium, gallium phosphide, gallium nitride, gallium arsenide, or indium phosphide.

The isotropically defined cavity may have a substantially uniform depth.

Some embodiments further include a pressure relief channel defined in the substrate between the cavity and a region of the substrate surface not covered by the substantially continuous film.

In accordance with another aspect of the present invention, a method of preparing a structure includes providing a substrate having a surface; providing a substantially continuous film at the substrate surface; diffusing an etchant through the substantially continuous film; and transmitting a laser beam through the substantially continuous film, the etchant isotropically etching the substrate in a region defined by the laser beam so as to define a cavity underlying a portion of the substantially continuous film.

The substantially continuous film may include a native oxide or a thermal oxide. Alternatively, providing the substantially continuous film comprises chemical vapor deposition, sputtering, physical vapor deposition, electrochemical deposition, molecular beam epitaxy, atomic layer deposition, or ion implantation. In one embodiment, providing the substantially continuous film comprises sequentially implanting ions of different types into the substrate. Providing the substantially continuous film may in some embodiments include forming an embedded layer in the substrate and then removing a portion of the substrate overlying the embedded layer.

The substantially continuous film may include silicon oxide, hafnium oxide, silicon nitride, diamond-like carbon, graphene, or silicon carbide of a selected phase.

In accordance with another aspect of the present invention, a structure includes a substrate having a surface and a portion defining an isotropically defined cavity; and a film disposed at the substrate surface and spanning the isotropically defined cavity, the film comprising at least one of hafnium oxide ($HfO_2$), diamond-like carbon, graphene, and silicon carbide (SiC) of a predetermined phase. The structure may further include at least one access hole defined in the film. Alternatively, the film may be substantially continuous.

In accordance with still another aspect of the present invention, a structure includes a substrate having a surface and a portion defining an isotropically defined cavity; and a multi-layer film disposed at the substrate surface and spanning the isotropically defined cavity. The multi-layer film may include one or more of silicon oxide, hafnium oxide, silicon nitride, diamond-like carbon, graphene, and silicon carbide of a selected phase. The structure may include at least one access hole defined in the film. Alternatively, the multi-layer film may be substantially continuous.

DETAILED DESCRIPTION

Figure 1A:
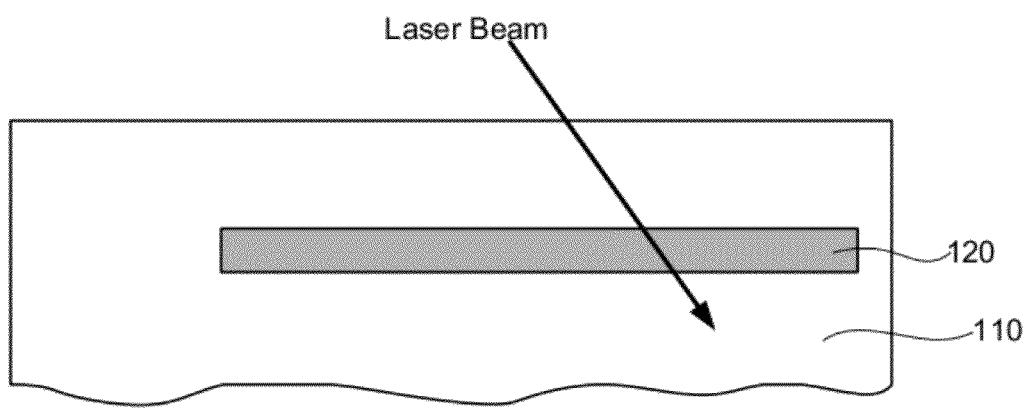
FIGS. 1A-1B illustrate cross-sectional views of prior art structures that may be formed using laser-assisted chemical etch (LACE).
Figure 1B:
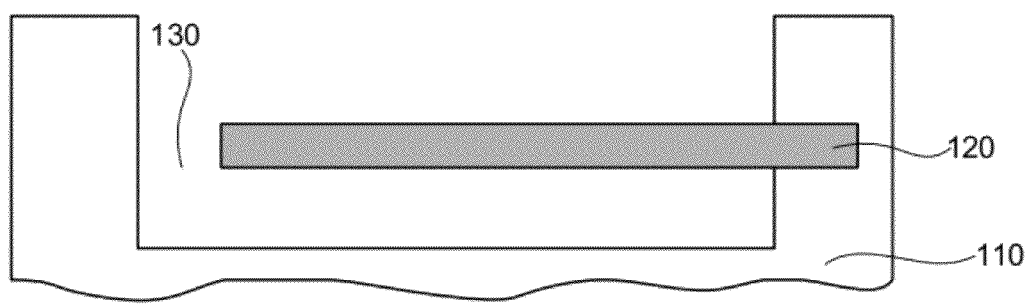

Embodiments of the present invention provide systems and methods that use laser-assisted chemical etch to prepare free-standing films. In some embodiments, the free-standing films are substantially continuous, having a substantially uniform thickness and a substantially uniform composition through the thickness, thus resulting in enhanced structural integrity. Such continuous films may be provided by using a diffusive process that obviates the need to provide pores or access holes through the film during excavation of the underlying substrate, as is done in the above-mentioned Sugino and Winer references. For example, a structure including a substrate and a film disposed thereon may be exposed to a chemical etchant and to a laser beam. The etchant diffuses through the film and etches the underlying substrate in a region defined by the laser beam, without the need to provide access holes or otherwise disturb the structural integrity of the film. Some non-limiting examples of free-standing films that may be so prepared include oxides such as $SiO_2$ or hafnium oxide ($HfO_2$), silicon nitride ($Si_3N_4$), diamond-like carbon, graphene, and silicon carbide (SiC) of a desired phase. Reaction products of the etch may be removed by allowing them either to diffuse through the film, or by providing a pressure-relief channel in the substrate as described further below. Additionally, the process conditions are preferably selected such that the etch proceeds isotropically, that is, substantially independently of the crystallographic orientation of the substrate. As a result, the cavity may be formed in the substrate so as to have a substantially uniform depth, or any other desired shape.

In other embodiments, LACE is used to provide free-standing films having compositions other than solely $SiO_2$ or solely silicon nitride, as was done in Sugino and Winer. For example, the films may be any insulator, conductor, or semiconductor that is suitable for the intended use of the free-standing film and is compatible with the process conditions. Some non-limiting examples of free-standing films that may be so prepared include oxides such as hafnium oxide ($HfO_2$), diamond-like carbon, graphene, and silicon carbide (SiC) of a desired phase. The systems and methods provided herein also may be used to prepare free-standing multilayer films, such as an $HfO_2/SiO_2$ multilayer film, or a diamond-like carbon/$SiO_2$ multilayer film. Optionally, access holes may be provided in such films to facilitate contact between the etchant and the substrate, and to facilitate removal of the reaction products of the etch. Alternatively, the reaction products may be removed by allowing them either to diffuse through the film, or by providing a pressure-relief channel in the substrate as described further below. The process conditions are preferably selected such that the etch proceeds isotropically, that is, substantially independently of the crystallographic orientation of the substrate. As a result, the cavity may be formed in the substrate so as to have a substantially uniform depth, or any other desired shape.

First, some exemplary structures that may be formed under the present invention, and an illustrative method for forming same, will be provided. Then, various alternative embodiments of structures that may be formed will be described. Then, an exemplary system for forming free-standing films will be described. Lastly, several examples of free-standing films will be described.

Figure 2A:
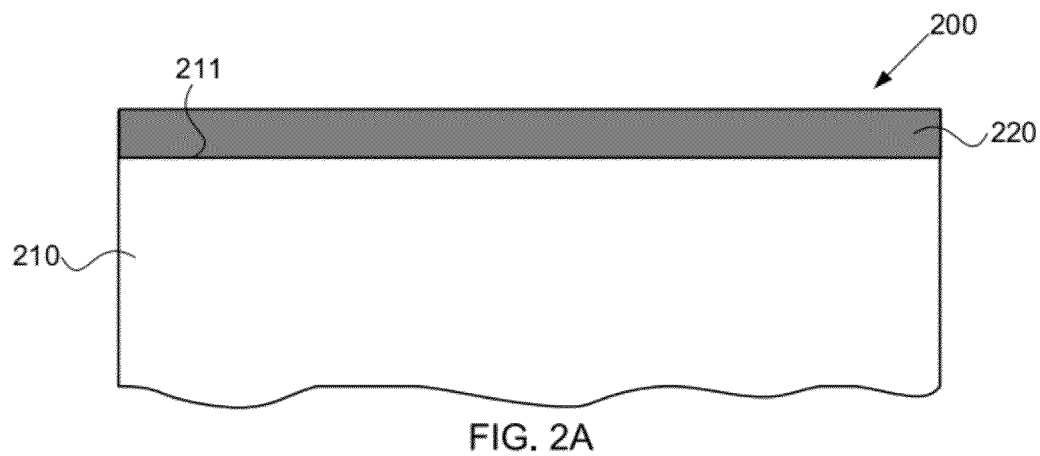
FIGS. 2A-2D illustrate cross-sectional views of structures that may be formed while preparing a free-standing film using LACE, according to some embodiments.
Figure 2B:
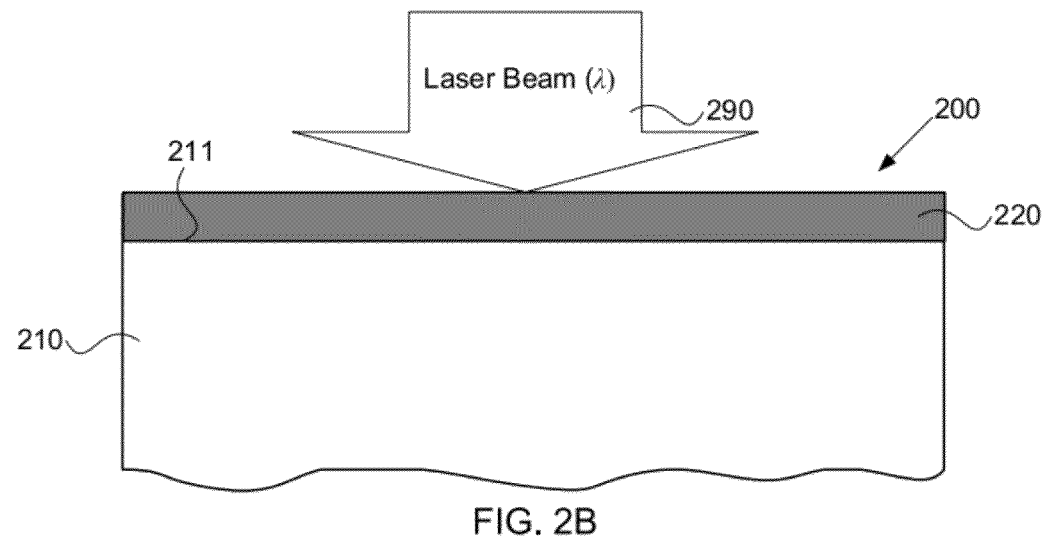

FIGS. 2A-2D illustrate cross-sectional views of structures that may be formed while preparing a free-standing film using LACE, according to some embodiments. Specifically, FIG. 2A illustrates precursor structure 200, which includes substrate 210 having upper surface 211, and film 220 disposed on the upper surface 211 of substrate 210. Substrate 210 may be a bulk substrate, such as a semiconductor wafer, optionally having one or more unpatterned and/or patterned films deposited thereon. For example, substrate 210 may include one or more conductor layers, and/or one or more semiconductor layers, and/or one or more insulator layers (not shown) beneath upper surface 211, as well as any suitable support for such layers. Examples of suitable substrates include, but are not limited to, silicon (Si), germanium (Ge), gallium phosphide (GaP), gallium nitride (GaN), gallium arsenide (GaAs), and indium phosphide (InP). In one embodiment, the substrate is an Si wafer.

Film 220 is disposed on at least a portion of substrate upper surface 211. In the illustrated embodiment, film 220 covers substantially the entire upper surface 211 of substrate 210, while in other embodiments (described further below), film 220 is patterned so as to cover only a portion of the upper surface 211 of substrate 210. Film 220 has a chemical composition suitable for the intended purpose of the free-standing film, e.g., film 220 is insulator layer, or a conductor layer, or a semiconductor layer. The chemical composition of film 220 also preferably is compatible with the processing parameters to be used to form a cavity in substrate 210 beneath film 220. Additionally, in some embodiments, the thickness of film 220 is selected such that a sufficient amount of a suitable chemical etchant may diffuse through the film so as to etch substrate 210 on a practical laboratory timeframe, e.g., within less than 24 hours, or within less than 12 hours, or within less than 6 hours, or within less than 2 hours, or within less than 1 hour, or within less than 20 minutes. Film 220 is also at least partially transparent to the wavelength of laser light to be used to enhance the rate of reaction between the etchant and substrate 210. In some embodiments, film 220 is an oxide, such as $SiO_2$ or hafnium oxide ($HfO_2$), or is a nitride, such as silicon nitride ($Si_3N_4$). In another embodiment, film 220 is a diamond-like carbon film, a graphene film, or a silicon carbide (SiC) film of controlled phase, as described in greater detail below Now referring to FIG. 2B, precursor structure 200 is exposed to a chemical etchant (not shown), such as gaseous chlorine ($Cl_2$), and to laser beam 290, i.e., is exposed to a LACE process. The laser beam 290 and chemical etchant preferably are co-selected to etch substrate 210 selectively relative to film 220. For example, one or more wavelengths ($\lambda$) of light in the laser beam 290 may be relatively strongly absorbed by the substrate 210 as compared to film 220, resulting in selective heating of substrate 220 that speeds the reaction of the etchant with the substrate. Other light-based mechanisms for selectively enhancing the reaction of the etchant with the substrate also may suitably be used.

Figure 2C:
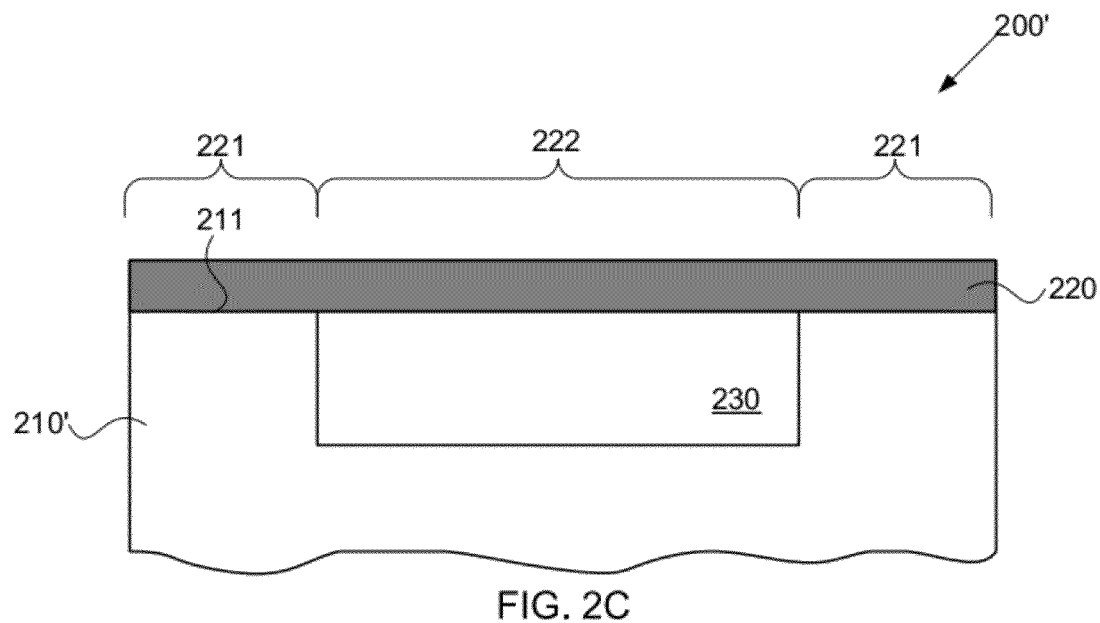

As illustrated in FIG. 2C, exposure to the chemical etchant and laser beam 290 forms structure 200', which includes modified substrate 210' having cavity 230 formed therein. Cavity 230 has a substantially uniform depth defined by the duration of exposure to the chemical etchant and laser beam 290. In the illustrated embodiment, the lateral extent of cavity 230 is defined by the lateral extent of laser beam 290. However, in other embodiments, such as described in the examples below, laser beam 290 may be rastered (scanned) across substrate 220 to form a cavity 230 having lateral dimensions defined by the spatial extents of beam 290 and the lateral dimensions along which the beam was rastered. Such rastering may also be used to prepare multiple cavities in substrate 220 beneath film 220, although only one such cavity 230 is illustrated in FIG. 2C.

In some embodiments, film 220 of structure 200' preferably has substantially the same thickness, continuity, and composition as it did in structure 200, that is, before exposure to the etchant and laser beam 290. In other embodiments, film 220 of structure 200 is initially too thick to permit the etchant to sufficiently diffuse through the film to reach substrate 210, and/or is initially too thick to permit sufficient laser light to penetrate through the film to reach substrate 210, on a practical timeframe. In such embodiments, the chemical etchant and/or the laser light may etch film 220 until the film becomes sufficiently thin for the etchant and/or laser light to reach substrate 210, at which point the etchant preferentially etches the substrate 210 relative to film 220. In either of the two embodiments, however, film 220 preferably remains substantially continuous during exposure to the chemical etchant and laser beam. The reaction products may diffuse through film 220 during processing, or a pressure relief channel may be provided in the substrate, as described in greater detail below.

Figure 2D:
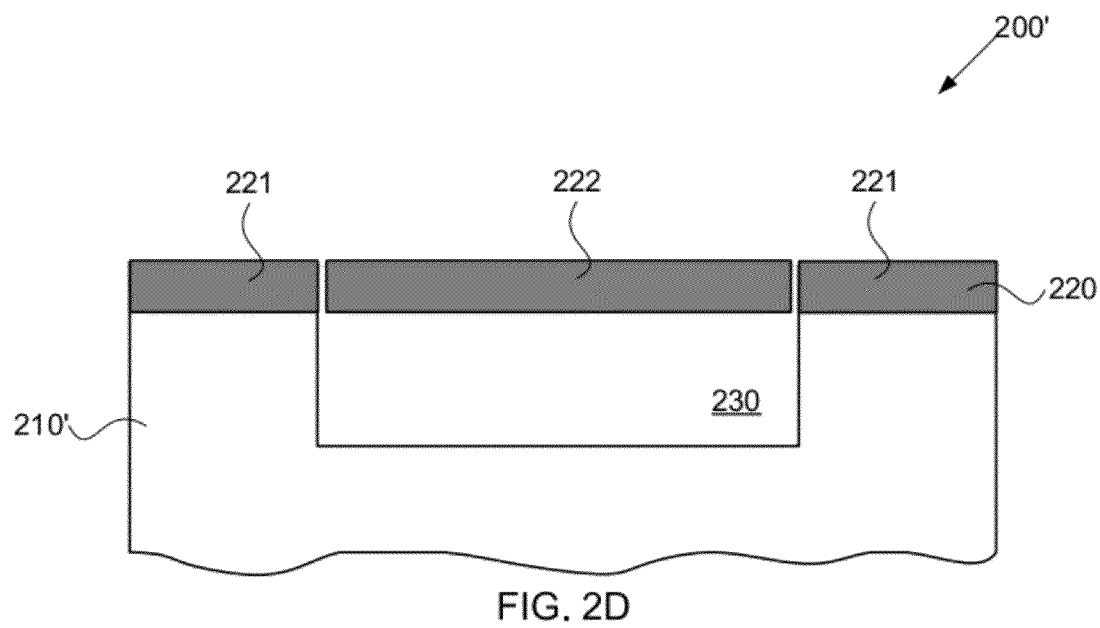

As illustrated in FIG. 2C, following the LACE process, one or more portions 221 of film 220 remain disposed on the upper surface 211 of substrate 210', while another portion 222 of film 220 is suspended over cavity 230. Film portion 222 is considered to be "free-standing" because it has substantially no supporting structure directly underneath it. Instead, free-standing film portion 222 is suspended over cavity 230, and held in place via portion 222's physical connections to portions 221. Free-standing film portion 222 optionally may be partially or completely freed from structure 200', e.g., using a free-ion beam (FIB) or other suitable technique known in the art, such as mechanical or laser-based cutting, to sever the physical connection(s) between free-standing portion 222 and one or both of portions 221. For example, as illustrated in FIG. 2D, free-standing portion 222 is entirely severed from portions 221 and may be physically removed from structure 200'.

Figure 3:
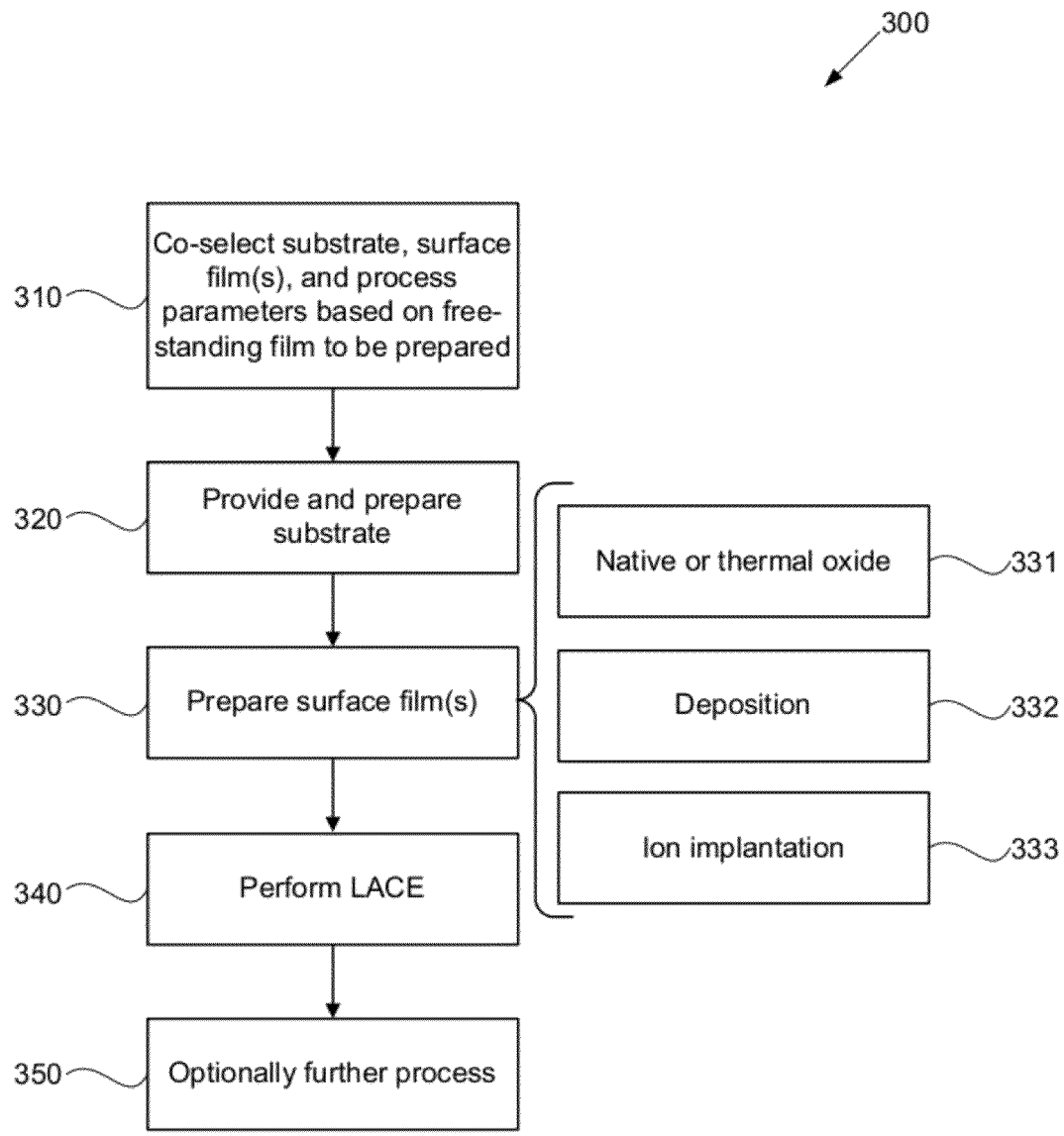
FIG. 3 is a flow chart of steps in an illustrative method for preparing a free-standing film using LACE, according to some embodiments.

Now referring to FIG. 3, an exemplary method 300 of forming a free-standing film includes co-selecting a substrate, surface film(s), and process parameters based on the free-standing film to be prepared (step 310). As noted above, the film (which may be a single-layer or a multi-layer film), is selected based on its intended use. Additionally, in embodiments in which the free-standing film is not intended to be completely removed from the substrate, the composition of the substrate, as well as any other structures provided therein, is selected based on the intended use of the substrate/free-standing film structure. In the following description, reference is made to FIGS. 4A-4C and 5A-5C as illustrating individual steps of the method.

The etchant, laser wavelength, and any other process parameters such as pressure and temperature may be selected so as to preferentially etch the substrate relative to the film(s). For example, the laser wavelength may be selected based on the relative reactivities of the substrate and the film to the etchant when exposed to that wavelength, as well as based on the relative absorption coefficients of the substrate and the film at that wavelength. Preferably, the thickness and/or composition of the film(s) may be selected to be at least partially transparent to the laser wavelength so as to allow the light to irradiate the substrate and enhance reaction between the etchant and the substrate.

The film composition preferably is compatible with the process parameters to be used to form a cavity in the substrate beneath the film. For example, in some embodiments, the thickness and/or composition of the film(s) may be selected so as to allow the etchant to diffuse therethrough to the substrate on a practical timeframe for the process. Optionally, the thickness and/or composition of the film, as well as the process parameters, are further selected so as to allow the products of the reaction between the etchant and the substrate to diffuse through the film and into the ambient atmosphere on a practical timeframe for the process. Alternatively, a portion of the substrate that extends between the cavity region and a portion of the substrate may be removed (e.g., using LACE) to provide a channel through which the reaction products may flow. In still another alternative, for example where the film has a composition other than solely $SiO_2$ or silicon nitride and/or has multiple layers, access holes optionally may be provided through the film to facilitate contact between the etchant and the substrate.

Then, the selected substrate is provided and prepared (step 320), for example using any suitable technique known in the art. For example, the upper surface of the substrate may be suitably cleaned in preparation for forming a film thereon. As noted above, the substrate may include one or more additional layers therein, including insulators, conductors, and/or semiconductors.

Then, the selected surface film is prepared (step 330). Depending on the desired composition and thickness of the film, any of a variety of suitable techniques may be used to prepare the film. Preferably, the film is substantially continuous. The film may have any suitable thickness, e.g., between about 1 nm and about 10 µm, or between about 10 nm and about 1 µm, or between about 10 nm and about 300 nm, or between about 100 nm and about 500 nm. For example, in some embodiments, the surface film is a substantially continuous native oxide that naturally occurs on the surface of the substrate upon exposure to oxygen (step 331). Alternatively, step 331 may include preparing a "thermal oxide" by exposing the substrate to oxygen at high temperature, which may provide a substantially continuous film thicker than a native oxide.

Figure 4A:
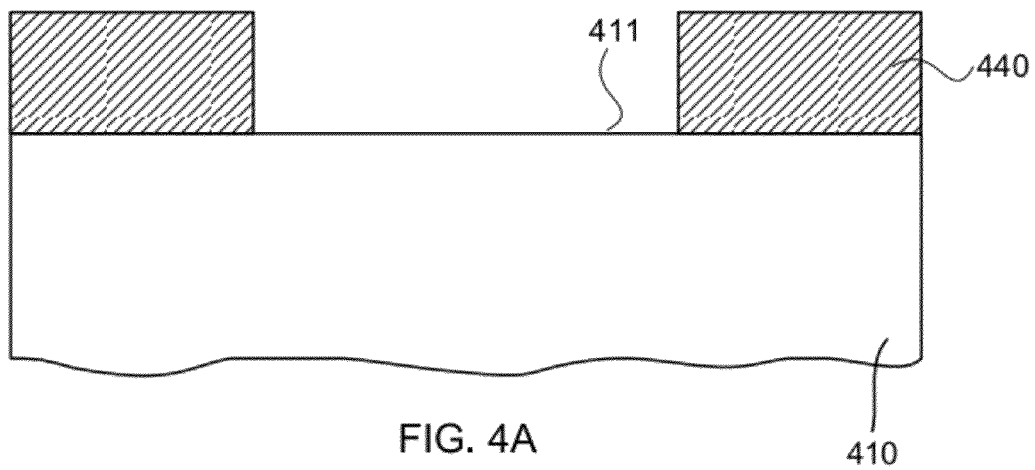
FIGS. 4A-4C illustrate cross-sectional views of structures that may be formed while preparing a free-standing film using LACE, according to some embodiments.
Figure 4B:
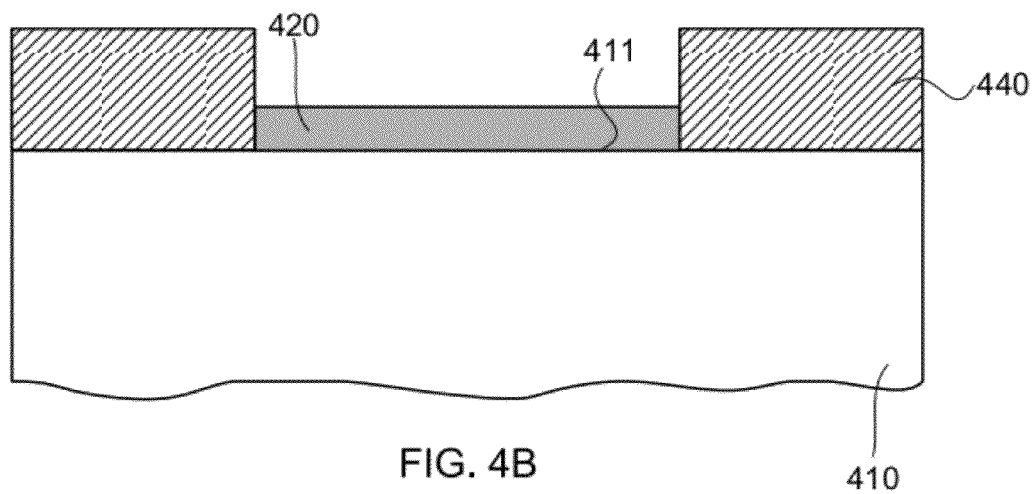

Alternatively, any suitable deposition technique known in the art may be used to prepare the film (step 332), such as chemical vapor deposition (CVD), sputtering, physical vapor deposition (PVD), electrochemical deposition, molecular beam epitaxy (MBE), atomic layer deposition (ALD), or the like. Optionally, the film may be patterned using a suitable patterning technique. For example, FIGS. 4A-4B illustrate intermediate structures formed during a method of preparing a patterned surface film using deposition. First, as illustrated in FIG. 4A, a mask 440 is provided on the upper surface 411 of substrate 410 using techniques well known in the art, e.g., using deposition and photolithographic patterning. Then, as illustrated in FIG. 4B, surface film 420 is deposited onto the region of upper surface 411 left exposed by mask 440, e.g., using sputtering. Mask 440 may then be removed, leaving behind patterned surface film 420.

Figure 5A:
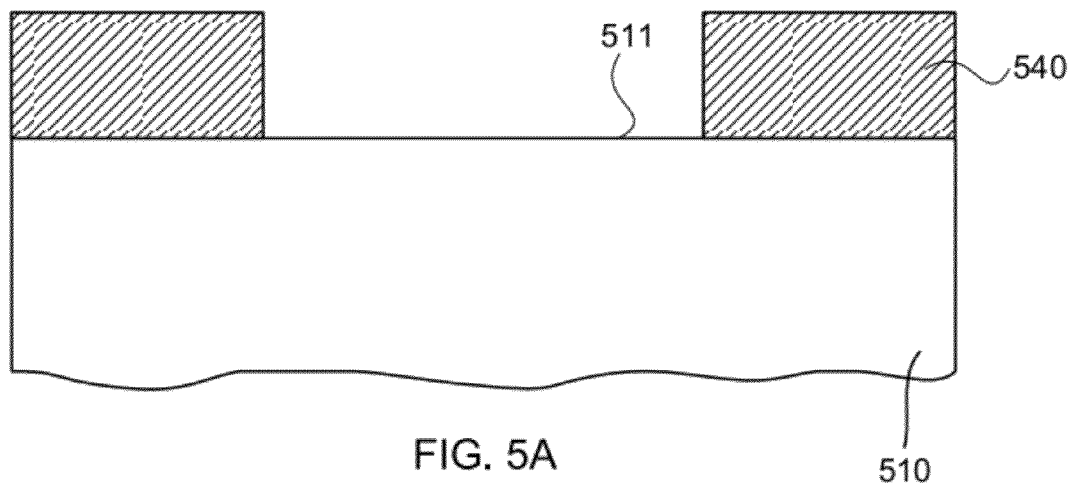
FIGS. 5A-5C illustrate cross-sectional views of alternative structures that may be formed while preparing a free-standing film using LACE, according to some embodiments.
Figure 5B:
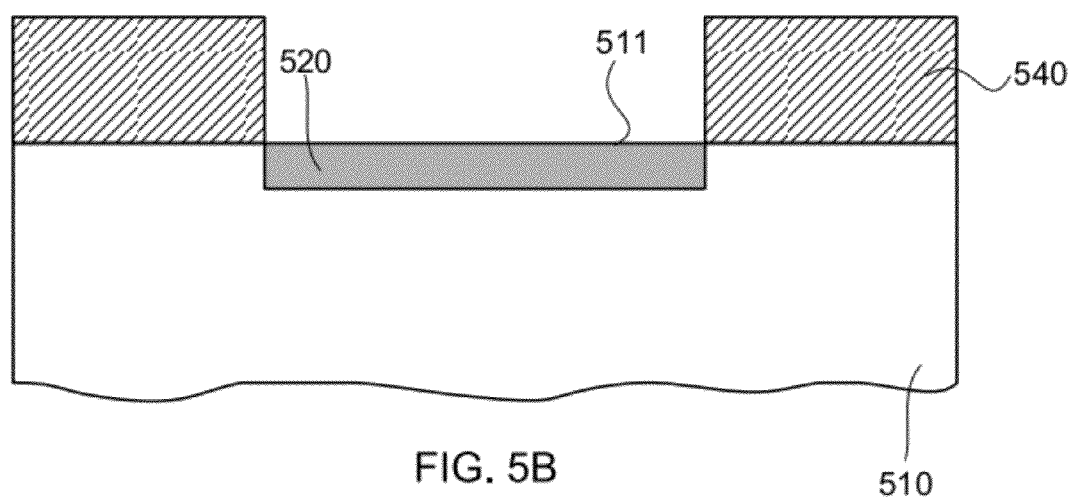

Referring again to FIG. 3, still another alternative is to prepare the surface film using ion implantation (step 333). For example, FIGS. 5A-5B illustrate intermediate structures formed during a method of preparing a patterned surface film using ion implantation techniques. First, as illustrated in FIG. 5A, a mask 540 is provided on the upper surface 511 of substrate 510 using techniques well known in the art, e.g., using deposition and lithographic patterning. Then, as illustrated in FIG. 5B, surface film 520 is prepared by implanting ions into the region of upper surface 511 left exposed by mask 540. Some non-limiting examples of suitable ions that may be thus implanted include oxygen (O), hydrogen (H), carbon (C), and nitrogen (N). The thickness of the implanted film depends on the energy distribution of the ions, with a narrower energy distribution providing a thinner film. Following ion implantation, the resulting structure optionally may be further processed as needed, e.g., by annealing at a temperature sufficient for the implanted ions to coalesce into a film or to suitably react with atoms in the substrate. For example, if the substrate is Si and the ions are 0, then an anneal step may be used to cause the implanted O ions to bond to the Si substrate to form an $SiO_2$ film. Mask 540 may then be removed, leaving behind patterned surface film 520. Note that in contrast to surface film 420, which is disposed on top of upper surface 411, film 520 is positioned immediately below upper surface 511. However, film 520 is still considered to be disposed at the surface of substrate 510 because there is no film or other structure above film 520.

Figure 4C:
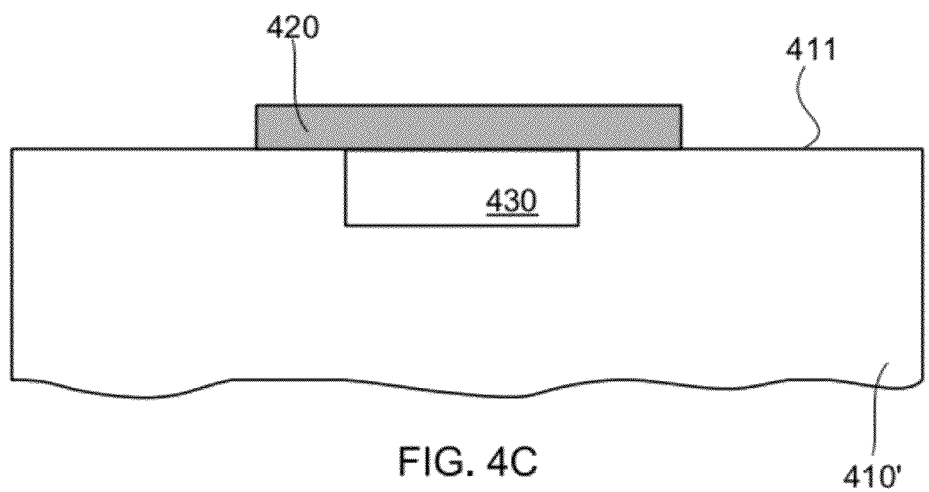
Figure 5C:
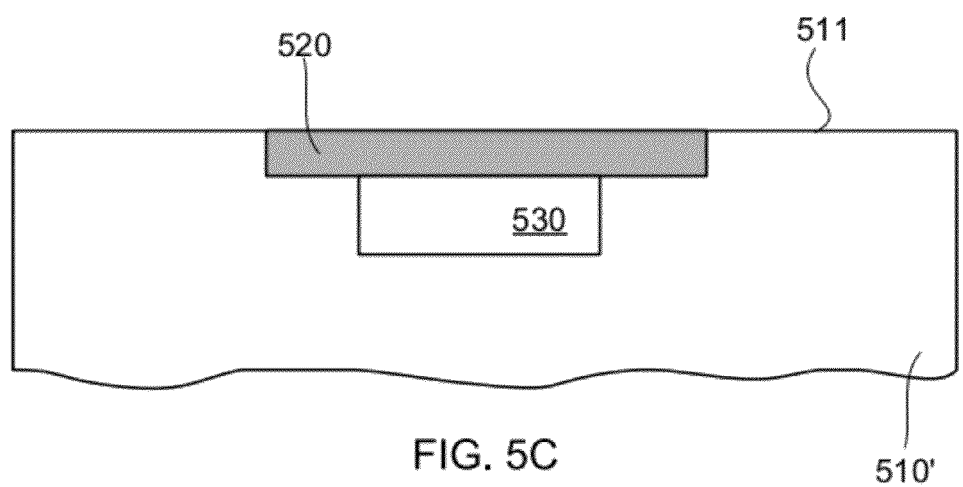

Referring again to FIG. 3, LACE is then performed on the surface film and substrate, e.g., the film and substrate are exposed to the selected etchant and laser beam under suitable process conditions (step 340). Examples of suitable etchants include $Cl_2$ gas and fluorine ($F_2$) gas. During such processing, the etchant diffuses through the film and reacts with the substrate, which reaction is enhanced by laser light that the film transmits to the substrate. The resulting reaction products then may diffuse through the surface film and escape, or optionally may be removed via a pressure relief channel. Such processing results in the isotropic formation of a cavity in the substrate beneath the surface film, creating a free-standing, substantially continuous portion of surface film suspended over a cavity of substantially uniform depth. For example, as illustrated in FIG. 4C, cavity 430 may be formed beneath patterned film 420 to form modified structure 400', or as illustrated in FIG. 5C, cavity 530 may be formed beneath patterned film 520 to form modified structure 500'.

Again referring to FIG. 3, the resulting structure optionally can be further processed (step 350). For example, one or more additional layers of material, such as a conductor, insulator, and/or semiconductor layer, may be provided over all or a portion of the free-standing portion of the surface film to provide a desired functionality. Or, for example, the free-standing portion of the surface film can be removed from the structure and used separately, optionally following other further processing steps (e.g., after depositing another layer over the free-standing portion of the surface film). Such removal may be accomplished by cutting the free-standing portion of the film, for example, using FIB, mechanical cutting, or laser cutting.

Ion implantation may be used to prepare certain types of surface films, such as diamond-like carbon films, graphene films, and silicon carbide (SiC) films having a preselected phase, that may not be prepared using other methods. The phrase "diamond-like carbon film" means a film formed primarily of C, or essentially of C, or even completely of C. Such film may be formed, for example, using a Si substrate that has an $SiO_2$ film embedded therein. Such an $SiO_2$ film may, for example, be formed by implanting O ions into the substrate and annealing the resulting structure. C ions then may be implanted within the embedded $SiO_2$ film, and the resulting structure subsequently annealed. Such annealing may cause the C ions to bond to each other, resulting in the formation of a "diamond-like" carbon film. The diamond-like carbon film then may be exposed at the surface of the substrate by removing the portion of the substrate and the $SiO_2$ layer that overlie the diamond-like carbon film using LACE, e.g., as described in U.S. Pat. Nos. 7,419,915 and 7,419,917. Then, the systems and methods provided herein may be used to remove portions of the substrate and $SiO_2$ that lie beneath the diamond-like carbon film, thus providing a free-standing diamond-like carbon film. For further details on systems and methods of preparing diamond-like carbon films, graphene films, silicon carbide (SiC) films having a preselected phase, and other types of films using ion implantation, see U.S. patent application Ser. No. 12/584,939, filed Sep. 14, 2009 and entitled "Systems and Methods for Preparing Films Using Sequential Ion Implantation, and Films Formed Using Same," the entire contents of which are incorporated by reference herein.

Figure 6:
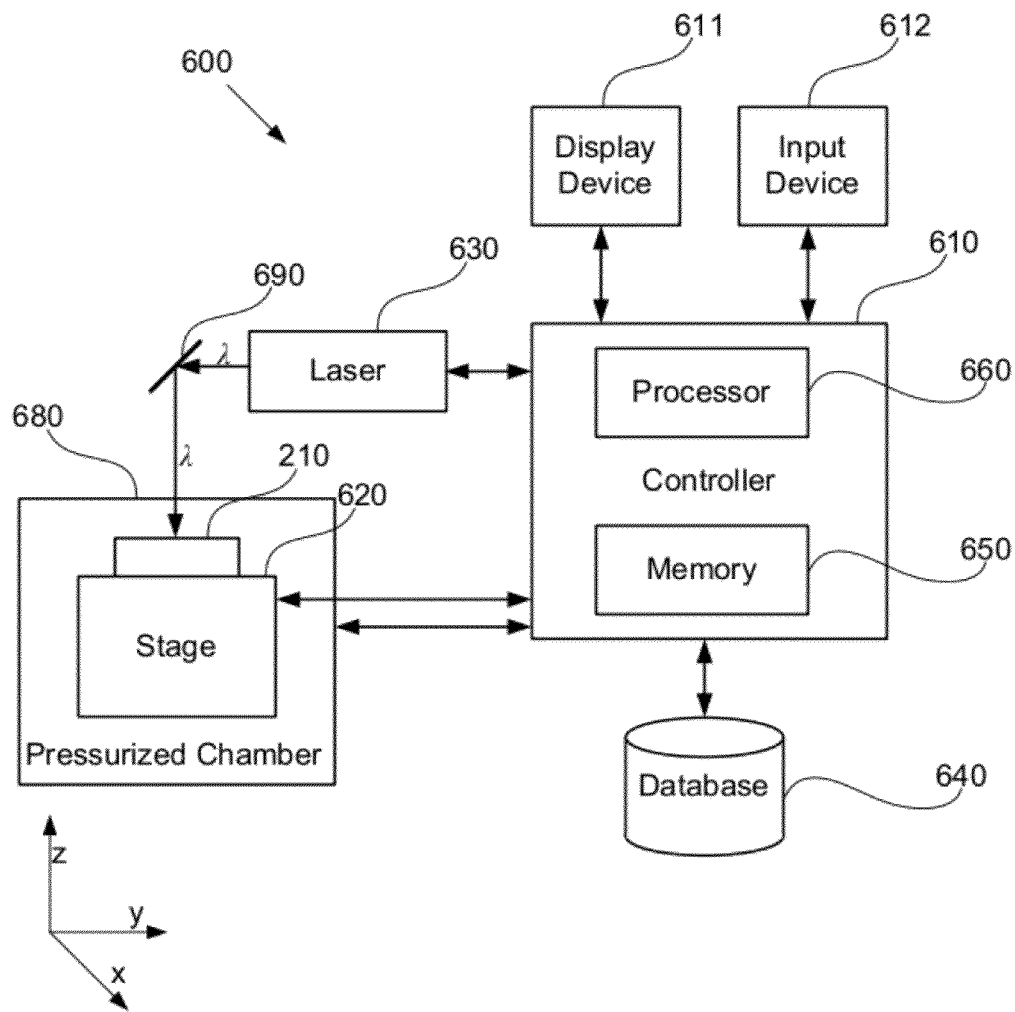
FIG. 6 schematically illustrates a system for preparing a free-standing film using LACE, according to some embodiments.

FIG. 6 schematically illustrates a system 600 for use in preparing free-standing films using LACE, according to some embodiments. System 600 includes controller 610, stage 620, laser 630, database 640, pressurized chamber 680, mirror 690. Controller 610 is in operable communication with stage 620, laser 630, database 640, pressurized chamber 680, and mirror 690 (communication with mirror 690 not shown). Controller 610 includes memory 650 (e.g., a computer-readable medium) for storing processing instructions, processor 660 for executing the stored processing instructions, display 611 for displaying data to a user, and input device 612 for accepting input from a user. Database 640 contains information on how to prepare a variety of different types of films using sequential ion implantation. Database 640 may be integral to controller 610, or may be remote to controller 610 and in operable communication with controller 610 via a network, such as the Internet.

Stage 620 is positioned within pressurized chamber 680, and supports substrate 210 having a film disposed therein (not shown) and is operable to adjust the position of the substrate in the x, y, and z directions responsive to instructions from controller 610. Laser 630 emits light of a wavelength $\lambda$ selected to preferentially enhance the reaction of the etchant with substrate 210. Mirror 690 directs the light toward one or more regions of substrate 210 in accordance with instructions from controller 610, preferably through a window in pressurized chamber 680. In an alternative embodiment (not shown), stage 620 is used to move substrate 210 relative to the laser beam, instead of using mirror 690 to direct the light to different portions of substrate 210. Pressure chamber 680 is configured to maintain substrate 210 at a selected pressure of etchant gas, responsive to instructions from controller 610.

Responsive to user input provided through input device 612, e.g., user input defining the type and dimensions of free-standing film to be prepared, controller 610 requests database 640 to provide information on how to prepare that type of film. Responsive to the request, database 640 provides some or all of the following information to controller 610: the type of substrate 210 to be used; any required preparation thereof; the wavelength $\lambda$ of laser light to be used; the type of etchant to be used and the pressure thereof; and any additional processing to be performed after exposing the substrate 210 to the etchant and laser light. Controller 610 receives this information and stores it in memory 650. Processor 660 processes the stored information, and based on that information displays instructions to the user via display device 670 and controls stage 620, laser 630, pressurized chamber 680, and mirror 690 to process the substrate 210 as appropriate.

In one example, the user uses input device 612, e.g., a keyboard and mouse, to input to the controller that he desires to prepare a free-standing $HfO_2$ film. Responsive to that input, controller 610 requests database 640 to provide information on preparing such a film. Responsive to the request, database 640 provides a set of instructions to the controller 610, which controller 610 stores in memory 650. Processor 660 then processes the stored instructions to determine what information is to be displayed to the user via display device 611, and how the various components of the system are to be controlled. For example, processor 660 determines, based on the stored instructions, that substrate 610 is to be an Si wafer, and that an $HfO_2$ film is to be separately provided thereon using suitable methods, such as sputtering. Processor 660 then causes this information to be displayed to the user via display device 611 so that the user may separately obtain the Si substrate and provide the $HfO_2$ film thereon.

Next, the user places the prepared Si substrate 210 with $HfO_2$ film thereon on stage 620, and uses input device 612 to inform controller 610 that the substrate is ready. Responsive to this input, processor 660 instructs stage 620 to move to a pre-determined position in the x, y, and z directions and instructs pressurized chamber 680 to expose substrate 210 to a suitable etchant at a suitable pressure, based on the stored instructions. Processor 660 then instructs laser 630 to emit light having wavelength $\lambda$, and instructs mirror 690 to guide that light to the appropriate region(s) of substrate 210. The etchant diffuses through the $HfO_2$ film and undergoes an enhanced reaction with substrate 210 responsive to exposure to the light, thus forming a free-standing $HfO_2$ film. Then, depending on the further processing defined in the stored instructions, processor 660 may display instructions to the user via display device 611 regarding any additional steps the user is to perform.

Those of skill in the art will appreciate that any of the user-performed steps may alternatively be automated using commercially available equipment (not illustrated). For example, instead of displaying to the user what type of substrate and film is to be provided, controller 610 may instead be in operable communication with a robotic substrate handler that may obtain substrate 610 from a substrate store, and may process the substrate as required to provide the film thereon and then etch the substrate to make the film free-standing. In one embodiment, one or more steps of an instruction sequence are made contingent on a feedback parameter, such as a spectrum of light reflected from the substrate.

Some non-limiting examples of free-standing single-layer and multi-layer films formed using LACE will now be described with reference to FIGS. 7A-10.

Figure 7A:
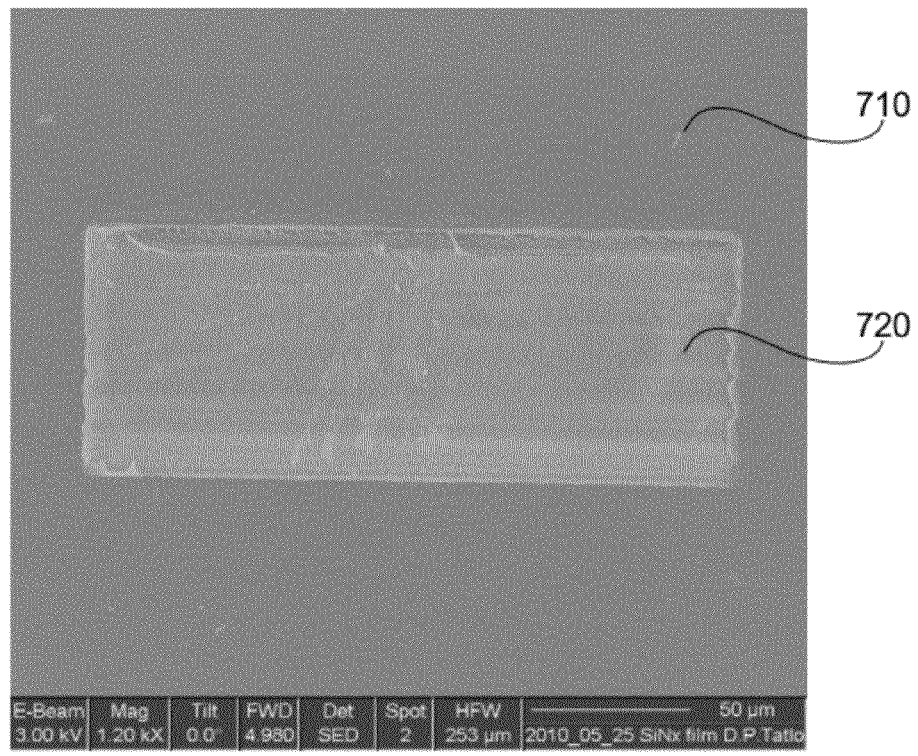
FIGS. 7A-7B are images of free-standing silicon nitride films prepared using LACE, according to one example.

FIG. 7A is a scanning electron microscopy (SEM) image of an exemplary freestanding silicon nitride ($Si_3N_4$) film 720 on an Si substrate 710. The $Si_3N_4$ film 720 was prepared by sputtering an $Si_3N_4$ film of 100 nm thickness onto an Si substrate that was cleaned using conventional methods. Native oxide on the surface of the Si substrate was not removed prior to the $Si_3N_4$ deposition. A region of Si substrate 710 was then excavated from beneath $Si_3N_4$ film 720 using LACE processing that included exposing the structure to $Cl_2$ gas of approximately 100 mTorr pressure and approximately 0.5 W of light from a broad-spectrum continuous-wave (CW) argon-ion laser and focused to a beam waist of approximately 3 $\mu$m. The laser beam was rastered over substrate 710 in a rectangular pattern, resulting in a corresponding rectangular cavity (not visible in FIG. 7A).

Figure 7B:
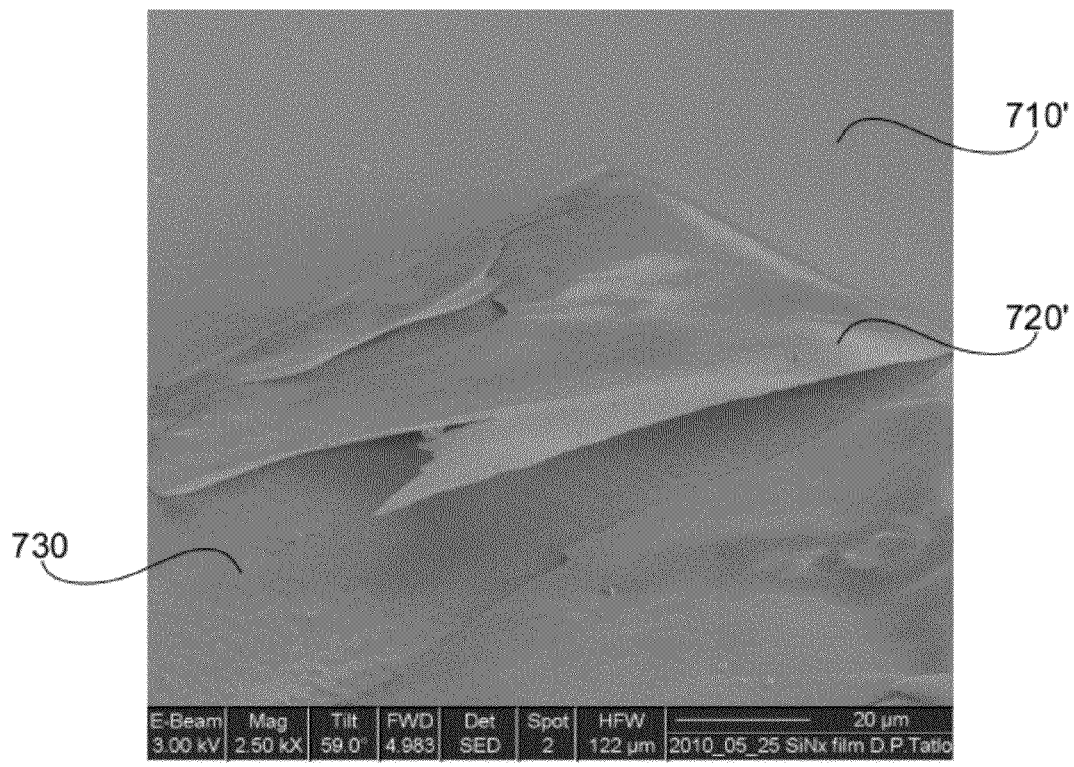

As can be seen in FIG. 7A, $Si_3N_4$ film 720 is substantially continuous. Such continuity may in some circumstances make it difficult to visually distinguish the $Si_3N_4$ film 720 from the underlying substrate 710 or to appreciate the structure's characteristics. Therefore, FIG. 7B is also provided, which is an SEM image of a similarly prepared but broken $Si_3N_4$ film 720' over Si substrate 710'. From FIG. 7B it can be seen that film 720', if unbroken, would overlie cavity 730 defined in substrate 710'.

Figure 8A:
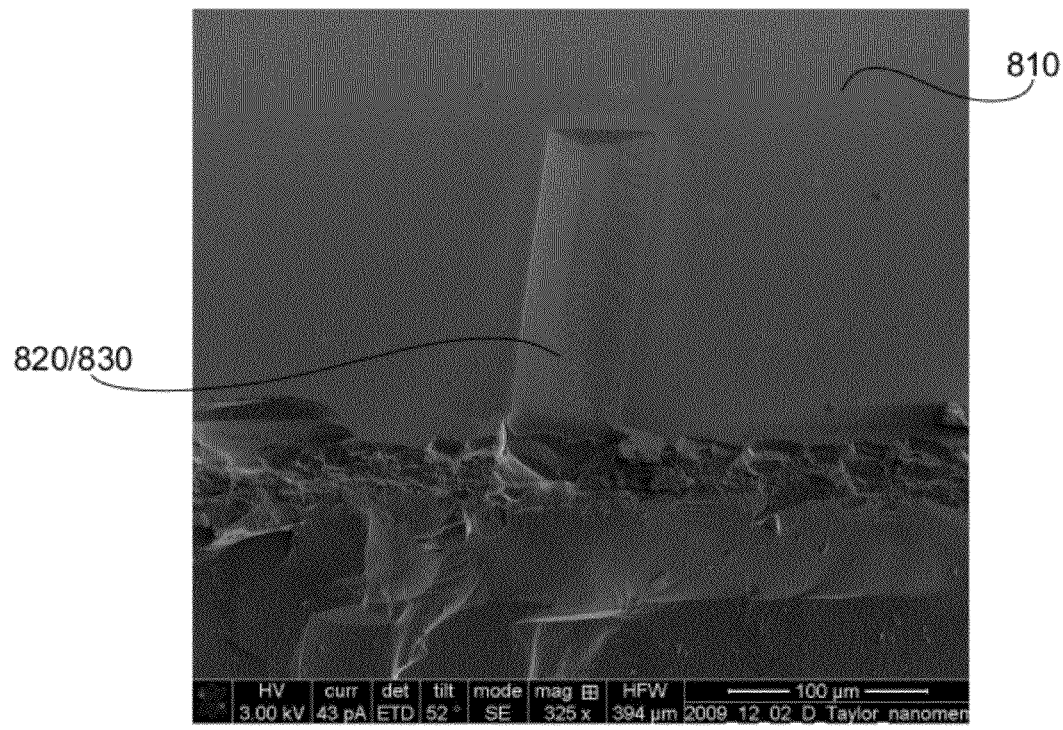
FIGS. 8A-8B are images free-standing silicon oxide films prepared using LACE, according to one example.

FIG. 8A is an SEM image of an exemplary freestanding $SiO_2$ film 820 on an Si substrate 810. The $SiO_2$ film 820 was an approximately 20 nm thick native oxide that formed on the surface of the Si substrate without user intervention. A region of Si substrate 810 was then excavated from beneath $SiO_2$ film 820 using LACE processing that included exposing the structure to $Cl_2$ gas of approximately 100 mTorr pressure and approximately 0.5 W of light from a broad-spectrum CW argon-ion laser and focused to a beam waist of approximately 3 $\mu$m. The laser beam was rastered across substrate 810 in a rectangular pattern, resulting in a corresponding rectangular cavity 830.

Figure 8B:
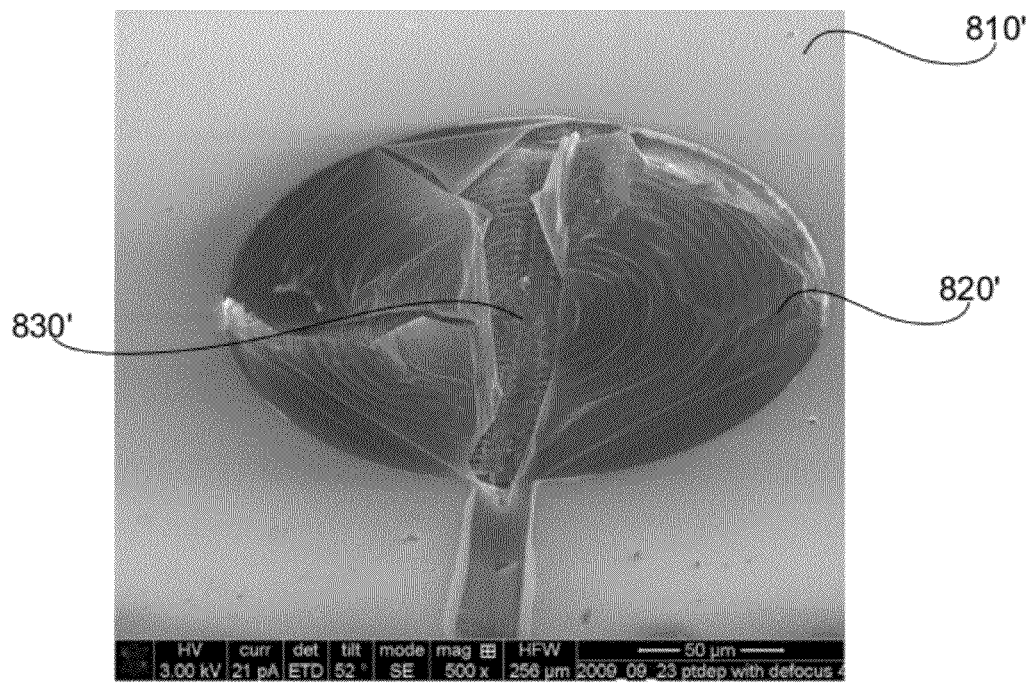

$SiO_2$ film 820 is substantially continuous and is suspended over cavity 830, but it is difficult to visually distinguish the $SiO_2$ film 820 from cavity 830 or to appreciate the structure's characteristics. Therefore, FIG. 8B is also provided, which is an SEM image of a similarly prepared but broken $SiO_2$ film 820' suspended over cavity 830' in Si substrate 810'. The structure of FIG. 8B was prepared by circularly rastering the same laser beam as was used in FIG. 8A over substrate 810'. From FIG. 8B it can readily be seen that film 820', if unbroken, would overlie cavity 830' defined in substrate 810'. It can also be seen that cavity 830' varies somewhat in depth, in a circular pattern. Without wishing to be bound by any theory, these height variations are believed to caused by an asymmetry in the shape of the laser beam, which results in some regions of substrate 810' being exposed to the laser beam for more time than other regions as the beam is circularly rastered across the substrate. It is believed that any depth variations of cavity 830 may readily be resolved using standard engineering techniques.

Figure 9A:
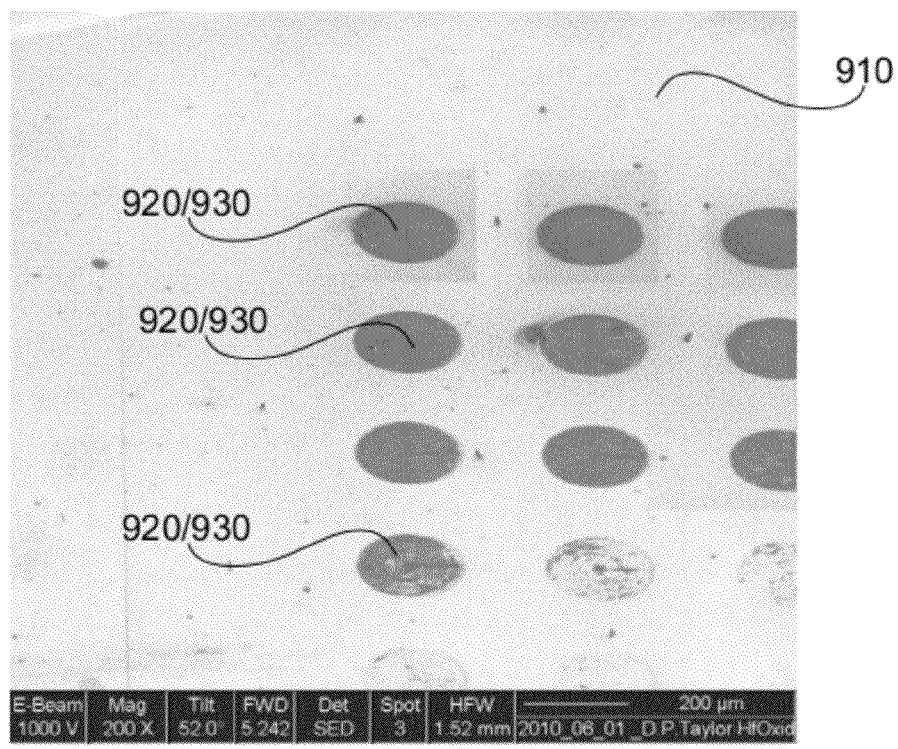
FIGS. 9A-9B are images of free-standing hafnium oxide films prepared using LACE, according to one example.
Figure 9B:
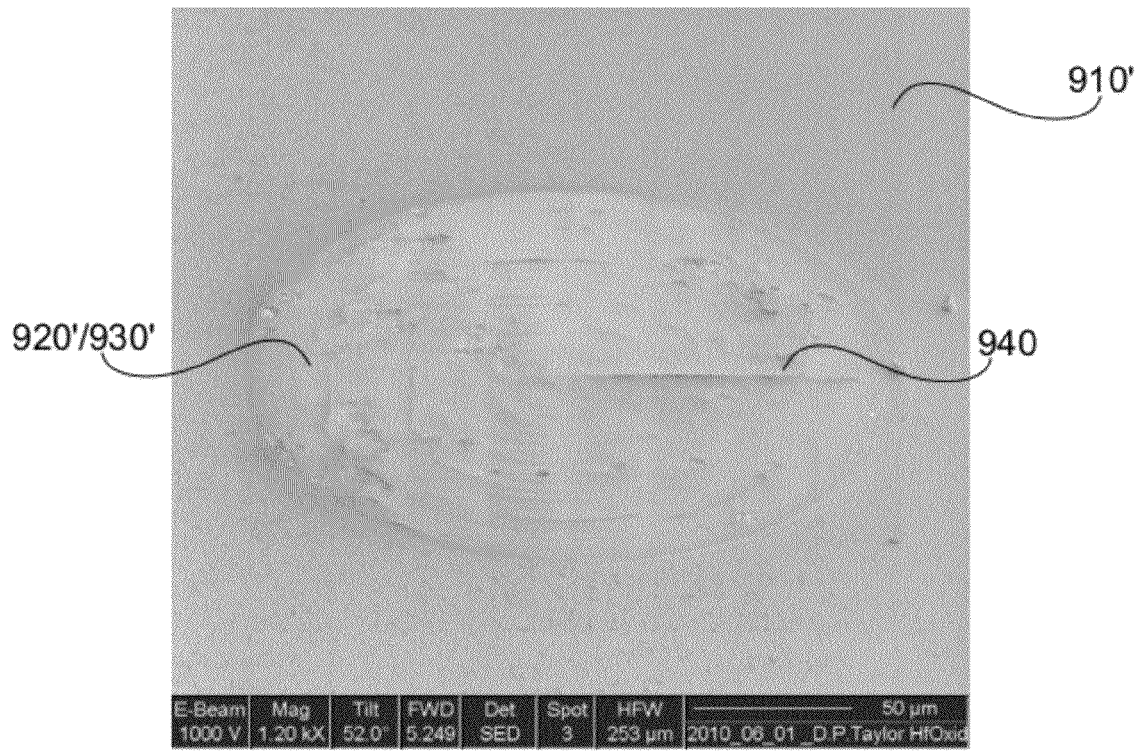

FIG. 9A is an SEM image of an exemplary freestanding HfO$_2$ film 920 on an Si substrate 910. The HfO$_2$ film 820 was prepared by sputtering an HfO$_2$ film of 100 nm thickness onto an Si substrate that was cleaned using conventional methods. Native oxide on the surface of the Si substrate was not removed prior to the HfO$_2$ deposition. A region of Si substrate 910 was then excavated from beneath HfO$_2$ film 920 using LACE processing that included exposing the structure to Cl$_2$ gas of approximately 100 mTorr pressure and approximately 0.5 W of light from a broad-spectrum CW argon-ion laser and focused to a beam waist of approximately 3 μm. The laser beam was rastered across substrate 910 in multiple different regions, each in a circular pattern, resulting in a plurality of circular cavities 930.

As was also the case for the films of FIGS. 7A and 8A, it is difficult to visually distinguish substantially continuous HfO$_2$ film 920 from the cavity 930 over which it is suspended, or to appreciate the structure's characteristics. Therefore, FIG. 913 is also provided, which is an SEM image of a similarly prepared, but broken, HfO$_2$ film 920' suspended over cavity 930' in Si substrate 910'. Although cavity 930' is substantially obscured from view by HfO$_2$ film 920', various cracks in the HfO$_2$ film, such as crack 940, may be seen, which indicate that the film has separated from the underlying substrate 910'. It also appears that film 920' and/or cavity 930' have texture in a circular pattern. Without wishing to be bound by any theory, these texture variations are believed to be caused by an asymmetry in the shape of the laser beam, which results in some regions of substrate 910' being exposed to the laser beam for more time than other regions as the beam is circularly rastered across the substrate. It is believed that any resulting depth variations of cavity 930' may readily be resolved using standard engineering techniques.

Figure 10:
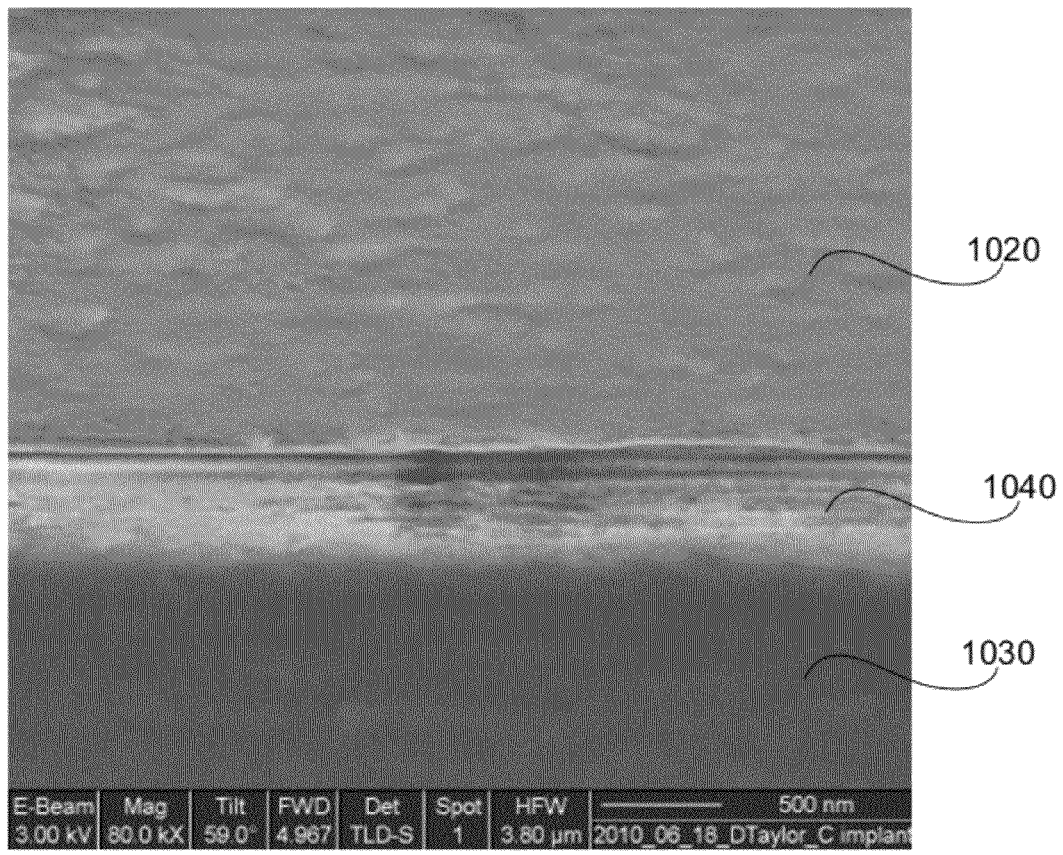
FIG. 10 is an image of a free-standing diamond-like carbon film prepared using LACE, according to one example.

FIG. 10 is a perspective SEM image of an exemplary freestanding multilayer structure including diamond-like carbon film 1020 and SiO$_2$ film 1040, both of which are suspended over cavity 1030 defined in an Si substrate (not visible in FIG. 10). The diamond-like carbon film 1020 was prepared by implanting O ions into an Si substrate and annealing the resulting structure to form SiO$_2$ layer 1040 embedded in the substrate and having a thickness of approximately 200 nm. Then, C ions were implanted into the upper portion of SiO$_2$ layer 1040, and the resulting structure annealed to form a diamond-like carbon layer of approximately 40 nm thickness positioned between SiO$_2$ layer 1040 and an overlying portion of the substrate. For further details on the preparation of diamond-like carbon films, see commonly assigned U.S. patent application Ser. No. 12/584,939.

The portion of the substrate overlying the diamond-like carbon film 1020 and SiO$_2$ layer 1040 was then removed using LACE processing that included exposing the structure to Cl$_2$ gas of pressure 400 mTorr and approximately 2.5 W of light from a broad-spectrum CW argon-ion laser that was focused to a beam waist of approximately 3 μm, and rastered across the portion of the substrate. The structure following this portion of the processing included diamond-like carbon film 1020 defining an upper surface, which was disposed on SiO$_2$ layer 1040, which was disposed on the underlying Si substrate. Then, to form a cavity beneath the diamond-like carbon film 1020 and SiO$_2$ layer, above process conditions continued to be applied to the remaining structure until cavity 1030 was observed to be formed.

While various illustrative embodiments of the invention are described above, it will be apparent to one skilled in the art that various changes and modifications may be made therein without departing from the invention. The appended claims are intended to cover all such changes and modifications that fall within the true spirit and scope of the invention.

What is claimed:

1. A structure comprising:
   a substrate having a surface and a portion defining an isotropically defined cavity;
   a substantially continuous film disposed at the substrate surface and spanning the isotropically defined cavity; and
   a pressure relief channel defined in the substrate between the cavity and a region of the substrate surface not covered by the substantially continuous film.

2. The structure of claim 1, wherein the film has a substantially uniform thickness and a substantially uniform composition through the thickness.

3. The structure of claim 1, wherein the film has a thickness between about 1 nm and about 1 μm.

4. The structure of claim 1, wherein the film comprises multiple layers.

5. The structure of claim 1, wherein the film comprises silicon oxide, hafnium oxide, silicon nitride, diamond-like carbon, graphene, or silicon carbide of a selected phase.

6. The structure of claim 1, wherein the substrate comprises silicon, germanium, gallium phosphide, gallium nitride, gallium arsenide, or indium phosphide.

7. The structure of claim 1, wherein the isotropically defined cavity has a substantially uniform depth.

8. A method of preparing a structure, the method comprising:
   providing a substrate having a surface;
   providing a substantially continuous film at the substrate surface;
   diffusing an etchant through the substantially continuous film;
   transmitting a laser beam through the substantially continuous film,
   the etchant isotropically etching the substrate in a region defined by the laser beam so as to define a cavity underlying a portion of the substantially continuous film; and
   providing a pressure relief channel defined in the substrate between the cavity and a region of the substrate surface not covered by the substantially continuous film.

9. The method of claim 8, wherein the substantially continuous film comprises a native oxide or a thermal oxide.

10. The method of claim 8, wherein providing the substantially continuous film comprises chemical vapor deposition, sputtering, physical vapor deposition, electrochemical deposition, molecular beam epitaxy, atomic layer deposition, or ion implantation.

11. The method of claim 8, wherein providing the substantially continuous film comprises sequentially implanting ions of different types into the substrate.

12. The method of claim 8, wherein providing the substantially continuous film comprises forming an embedded layer in the substrate and then removing a portion of the substrate overlying the embedded layer.

13. The method of claim 8, wherein the substantially continuous film comprises silicon oxide, hafnium oxide, silicon nitride, diamond-like carbon, graphene, or silicon carbide of a selected phase.

14. A structure comprising:
   a substrate having a surface and a portion defining an isotropically defined cavity;
   a substantially continuous film disposed at the substrate surface and spanning the isotropically defined cavity, the film comprising at least one of hafnium oxide (HfO$_2$), diamond-like carbon, graphene, and silicon carbide (SiC) of a predetermined phase; and a pressure relief channel defined in the substrate between the cavity and a region of the substrate surface not covered by the substantially continuous film.

15. The structure of claim 14, further comprising at least one access hole defined in the film.

16. The structure of claim 15, wherein the film is substantially continuous.

17. A structure comprising:

a substrate having a surface and a portion defining an isotropically defined cavity;

a substantially continuous multi-layer film disposed at the substrate surface and spanning the isotropically defined cavity; and a pressure relief channel defined in the substrate between the cavity and a region of the substrate surface not covered by the substantially continuous multi-layer film.

18. The structure of claim 17, wherein the multi-layer film comprises one or more of silicon oxide, hafnium oxide, silicon nitride, diamond-like carbon, graphene, and silicon carbide of a selected phase.

19. The structure of claim 17, further comprising at least one access hole defined in the film.

* * * * *